United States Patent [19]

Tang

[11] Patent Number: 5,629,892

[45] Date of Patent: May 13, 1997

[54] FLASH EEPROM MEMORY WITH SEPARATE REFERENCE ARRAY

[75] Inventor: Yuan Tang, San Jose, Calif.

[73] Assignee: Advanced Micro Devices, Inc., Sunnyvale, Calif.

[21] Appl. No.: 543,684

[22] Filed: Oct. 16, 1995

[51] Int. Cl.[6] .................................................. G11C 7/00
[52] U.S. Cl. ......................... 365/185.2; 365/185.22; 365/185.28
[58] Field of Search ......................... 365/185.2, 185.22, 365/185.28, 185.29, 185.3, 210

[56] References Cited

U.S. PATENT DOCUMENTS

| | | | |
|---|---|---|---|
| 5,077,691 | 12/1991 | Hadad et al. | 365/189.09 |
| 5,142,495 | 8/1992 | Canepa | 365/185.22 |
| 5,157,626 | 10/1992 | Watanabe | 365/185.22 |
| 5,335,198 | 8/1994 | Van Buskirk et al. | 365/189.29 |
| 5,386,388 | 1/1995 | Atwood et al. | 365/185.22 |

*Primary Examiner*—David C. Nelms
*Assistant Examiner*—Vu A. Le
*Attorney, Agent, or Firm*—Michael A. Lechter; James H. Phillips

[57] ABSTRACT

A memory device including an array of cells, where a reference current is generated by a predetermined number of reference cells disposed separate from the array of cells, the transconductance of such reference cells being equal to the transconductance of the cells of the array.

7 Claims, 5 Drawing Sheets

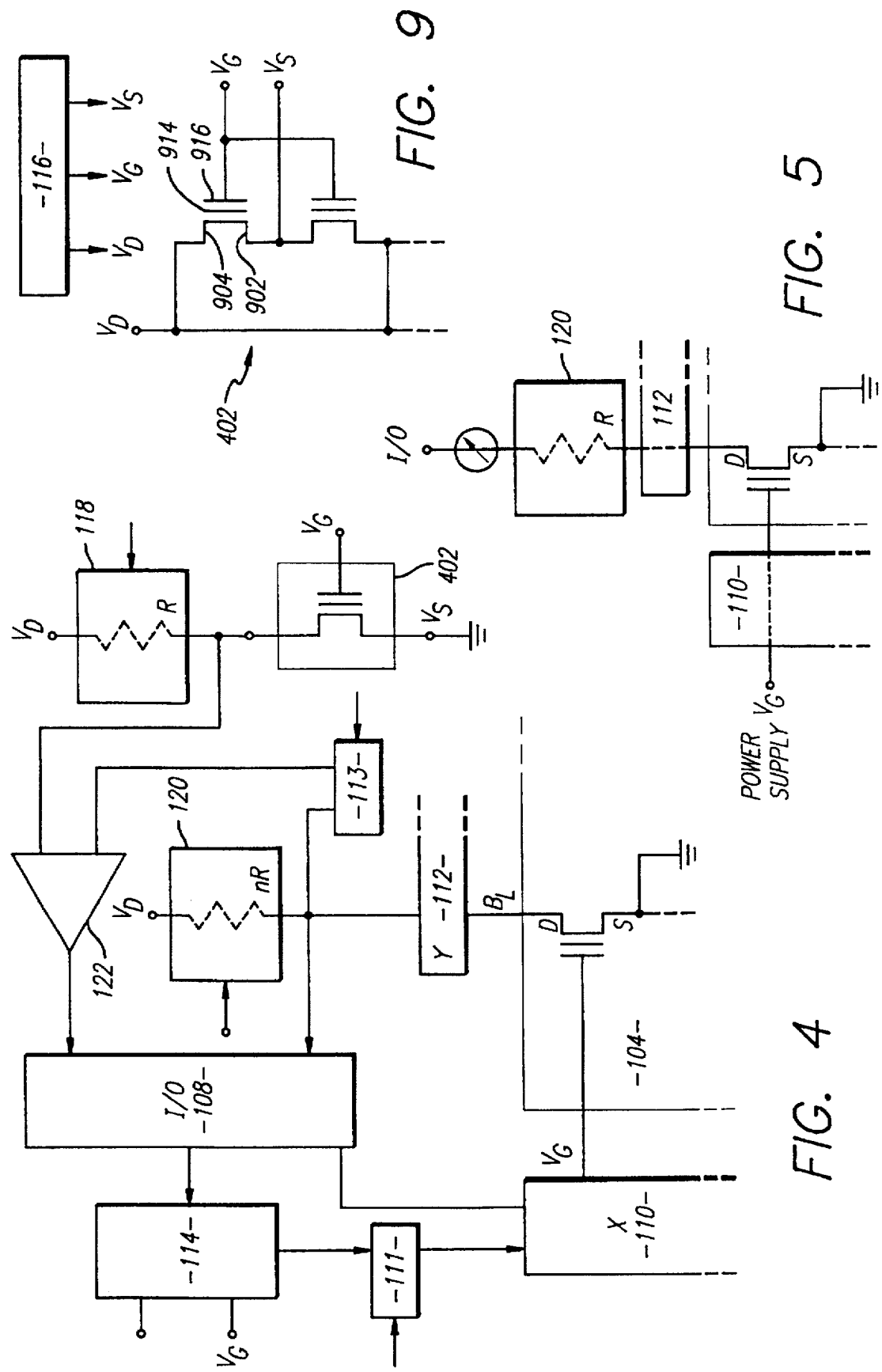

FLASH EEPROM MEMORY WITH SEPARATE REFERENCE ARRAY

BACKGROUND OF THE INVENTION

1. Field of the Invention

The present invention relates to semiconductor devices, and more particularly, to the design and manufacture of floating gate memory devices such as flash electrically erasable programmable read-only memory (EEPROM) devices having improved and more uniform performance characteristics.

2. Description of the Related Art

In general, memory devices such as a flash electrically erasable programmable read only memory (EEPROM) are known. For example, referring to FIGS. 1, 2, and 2A, a flash EEPROM 100, commonly comprises a single substrate 102 in which one or more high density regions 103 and a low density peripheral portion 106 are formed. High density region 103 typically comprises at least one M×N array core 104 of individually addressable, identical memory cells 200 (FIGS. 2, 2A). Low density peripheral portion 106 typically includes: suitable input/output (I/O) circuitry 108, suitable circuitry for selectively addressing the individual cells, e.g., one or more x-decoder 110 and y-decoder 112; suitable circuitry 114 for selectively connecting the source, gate, and drain of selected addressed cells to predetermined voltages or impedances to effect designated operations on the cell, e.g., programming, reading and erasing, and deriving necessary voltages to effect such operations; and sensing circuitry 116 for determining whether or not an addressed cell has been programmed, i.e. is 0 or 1.

Referring now to FIGS. 2 and 2A, each cell 200 in array 104 typically comprises: source 202, drain 204, and channel 206 semiconductor regions formed in substrate 102 (or in an isolation well); and a stacked gate (word line) structure 210. Gate structure 210 suitably comprises: a thin gate dielectric layer 212 (commonly referred to as the "tunnel oxide") formed on the surface of substrate 102 overlying channel 206; a floating gate 214 overlying tunnel oxide 212; an interpoly dielectric 216 overlying floating gate 214; and a control gate 218 overlying interpoly dielectric layer 216. Cells 200 are arranged in a series of rows and columns.

In the completed array, the control gates 218 of the respective cells 200 in a row are formed integral to a common word line (WL) associated with the row. Columns of cells are arranged such that adjacent cells in a column share a common semiconductor region as source or drain regions: The source 202 of each cell in a column (excepting end cells) is formed in a common region with one of the adjacent cells, e.g., the preceding cell in the column; Likewise, the drain of the cell is formed in a common region with the drain 204 of the other adjacent cell, e.g., next succeeding cell in the column. The drain of each cell in a column of cells is connected by a conductive bit line (BL) (FIG. 2) comprising an overlying layer of metal connected to each drain 204 of the cells 200 within the column. Additionally, the sources of each cell 200 in a row (and hence pairs of rows) are interconnected by a common source line CS (FIGS. 2A) formed in substrate 102, as will be described. Any particular cell 200 within array 104 can be individually addressed (programmed and read) by operating upon one word line and one bit line.

Current is selectively conducted between source 202 and drain 204 in accordance with the electric field developed in channel 206 by gates 214, 218. By appropriately charging (programming) and discharging (erasing) floating gate 214, the threshold voltage $V_T$ of cell 200 (i.e., the voltage $V_G$ that must be applied to control gate 218 to cause current flow between source and drain above a predetermined level) may be selectively varied to program cell 200.

An individual cell 200 is programmed by charging floating gate 214 through high energy electron injection, often referred to as hot electron injection. By applying the appropriate potentials to source 202, drain 204, and control gate 218, hot electrons are injected from channel 206 through tunnel dielectric 212 to negatively charge floating gate 214. Charging floating gate 214 with a negative potential raises the threshold voltage of the cell by a predetermined amount $V_S$ from a first nominal value $V_{T1}$ to a second nominal value $V_{T2}$. As a result, a programmed cell 200 ($V_T > V_{T2}$) conducts substantially less current during a subsequent read operation than an unprogrammed cell 200 ($V_T < V_{T1}$) having no charge on floating gate 214.

During a read operation, common source line cs is grounded, a predetermined voltage $V_D$ is applied to the drain (via the bit line), and a predetermined voltage $V_G$ is applied to control gate 218 (the word line of the row) of the selected cell 200. If the selected cell 200 is unprogrammed ($V_T < V_{T1}$), the gate voltage $V_G$ exceeds the threshold voltage $V_{T1}$ of the cell, and cell 200 conducts a relatively high current (above a predetermined upper threshold level, e.g. 100 microamps). On the other hand, if the selected cell 200 has been programmed ($V_T > V_{T2}$), gate voltage $V_G$ is less than the threshold voltage $V_{T2}$ of the cell, and the cell is non-conductive, or at least conducts less current (below a predetermined lower threshold level, e.g. 20 microamps). The state of the cell is typically tested in sensing circuitry 116 by comparing the current output against a reference current equal to a predetermined percentage (referred to as the sense ratio) of the current from an unprogrammed cell: Conduction by the cell at a level greater than the reference current, is indicative of a first state, e.g., a zero or logical low; Conduction at a level less than the reference current is indicative of a second state, e.g., one or logical high.

The reference current is conventionally generated by an additional reference column of cells 114 formed as part of core array 104. The "bit line" of the reference column is connected to sensing circuitry 116, and the sources of the cells are grounded, rather than connected to common source line CS. The control gates of the reference cells are, however, connected to the core array wordlines. Thus, since the cells of reference column 114 remain unprogrammed (uncharged), the reference cell in the selected row conducts in response to the predetermined voltage $V_G$ applied to the wordline (and hence to the gate of the reference cell) during a read operation.

Sensing circuitry 116 typically comprises a "reference" resistive network 118 and a "sense ratio" resistive network 120, and a comparator (e.g. sense amplifier) 122. Reference resistive network 118 manifests a predetermined nominal resistance R, whereas sense ratio resistive network 120 manifests a predetermined nominal resistance equal to a predetermined multiple of the reference resistance (nR). While resistive networks are, for clarity, shown in FIG. 2 as simple resistors, in practice they typically comprise variable resistance networks that present predetermined nominal resistances in accordance with control signals applied thereto Sense ratio resistive network 120 is effectively connected (e.g. though Y decoder 112) between the selected bit line (the drains of the cells in the selected column in array 104) and a predetermined voltage $V_D$. Reference resistive network 118 is effectively connected between a line connecting the drains of the cells in reference column 114 and a predetermined voltage source, e.g. the same voltage $V_D$, applied to the selected bit line (the drains of the cells in the selected column in array 104). Juncture 124 between reference resistive network 118 and the line connecting the drains of the cells in reference column 114, is connected to one input (e.g. the non-inverting input) of comparator 122. Juncture 126 between sense ratio resistive network 120 and (e.g. though Y decoder 112) the selected bit line to the other (e.g. inverting) input of comparator 122.

In a read mode, a connection is established from predetermined voltage $V_D$ (e.g., 1 to 1.5 volts) through sense ratio resistive network 120 (and Y decoder 112) to the selected bit line (and hence a voltage is provided at the drains of the cells in the selected column). The sources of the array cells are grounded. If any of the cells in the selected column are conductive, current will flow through sense ratio resistive network 120.

The cells in reference column 114 are all unprogrammed (i.e. hold no charge on the floating gates) and, indeed, are never programmed or erased in the normal course of operation. Accordingly, application of the predetermined voltage $V_G$ on the wordline will render the selected reference cell conductive, and current will flow through reference resistive network 118.

Comparator 122 generates indicia or the relative magnitudes of the current in the selected bitline and reference line. All other things being equal, the relative magnitudes of the currents is defined by the "sense ratio", i.e. the multiple (n) of resistance between resistive networks 120 and 118. Comparator 122 will indicate a programmed cell only if the bit line current is less than the reference current divided by n (i.e. $I_{BL} < (1/n) I_{REF}$). Such a memory device is described in commonly assigned U.S. Pat. No. 5,335,198, issued to Van Buskirk et al. on Aug. 2, 1994.

Use of part of core array 104 to provide the reference current is advantageous in that the cells of reference column 114, formed with the operative array as part of the same process, tend to be substantially identical to the cells of the operative array 104. However, use of complete columns of cells, which may include for example, 512 cells, occupies valuable space on the semiconductor substrate.

In contrast to the programming procedure, flash EEPROMs are typically bulk-erased, so that all of cells 200 in array 104 (i.e. connected to a common source line CS) are simultaneously erased. Appropriate potentials applied to the source 202, drain 204, and control gate 218, cause electron tunneling from floating gate 214 to source 202 (or drain 204) via Fowler-Nordheim (F-N) tunneling. For example, electrons stored during programming on floating gate 214 tunnel through dielectric 212 in the area (referred to as a tunnel region 203) where floating gate 214 overlaps source region 202. F-N tunneling occurs simultaneously for all cells 200 within memory array 104, erasing entire array 104 in one "flash" or operation.

Because each cell 200 is connected to common source line CS, all cells 200 in array 104 are erased for the same amount of time. Ideally, each cell 200 in array 104 requires the same amount of time to erase,i.e. to remove electrons from floating gate 214 and achieve a lower selected threshold voltage. Erase times among cells 200 within array 104, however, differ widely. Because of the variation in erase times, each cell 200 must be erased for the amount of time required to erase the slowest cell in array 104. Erasing faster cells 200 for too long, however, results in over-erasure.

Over-erasure generates a positive charge on floating gate 214, which excessively lowers the threshold voltage $V_T$ of cell 200, in some instances to the extent of establishing a negative threshold voltage ($V_T<0$). As a result, the over-erased cell 200 may be continuously activated, even when control gate 218 is grounded ($V_G=0$ volts), so that cell 200 always conducts during a read operation, regardless of whether over-erased cell 200 is the cell selected for reading. In addition, the increase $V_\delta$ in threshold voltage effected by programming, may not be sufficient to raise the threshold voltage $V_T$ of the over-erased cell above the predetermined voltage $V_G$ applied to control gate 218 of selected cell 200, so that even when programmed, the over-erased cell conducts upon application of $V_G$ during the read process, giving an erroneous reading.

The current conducted by over-erased cells 200 in a column during a read operation is known as "column leakage current." Column leakage current manifests itself by degrading or destroying the memory's reliability and endurance. As discussed above, the bit value of a selected cell 200 depends on the magnitude of the drain current provided at the associated bit line BL. Drain 204 of each cell 200 in a column, however, is connected to the associated bit line BL. Ideally, the only cell in the column biased for possible conduction is the cell in the selected word line WL; the predetermined voltage $V_G$ is applied to the gates of cells on the selected word line and all other gates are grounded during the reading process. If selected cell 200 is unprogrammed, current in excess of the reference current (generated by application of the predetermined voltage $V_G$ to the reference cells) will be provided on the bit line, indicating e.g., a zero. If the selected cell is programmed with a "1", the drain current of the cell (and, ideally, the bit line), is below the reference current during the read operation. However, the current in the bit line reflects the cumulative current flow from all of the cells in a column. Accordingly, if any of the cells in the column are over-erased and conduct significant current during the read operation, the current flow in the bit line may be in excess of the reference current. Consequently, the read operation generates a logical zero regardless of which cell in the column is selected or whether the selected cell is programmed. In severe cases, a single over-erased cell disables the entire column. In another case, many of the cells may be slightly over-erased which provides a cumulative column leakage current in excess of the upper threshold value. For example, if each cell in a column of 512 cells leaks 0.2 microamps, the total column leakage current is 102.4 microamps, in excess of the reference current (nominally 100 microamps), thereby disabling the entire column. Milder cases may simply degrade the performance of the memory over time, greatly reducing the reliability and endurance of the device, i.e. the number of cycles the device can be successfully programmed and erased.

The problem of over-erasure is recognized. For example, the above noted U.S. Pat. No. 5,335,198, to Van Buskirk et al., discloses an over-erasure correction method, involving performing a program verification each time a cell is programmed. A cell is programmed by applying pulses of a predetermined relatively high voltage (e.g. 12 v) to the wordline (gate), with a predetermined mid level voltage (e.g. 5.5 v) applied to the bit line (drain); and the source grounded. The program verification entails, in essence, applying a predetermined number of pulses to the wordline, then reading the current from the selected bit line (monitoring the output of the comparator), and continuing to apply the pulses to the word line until the bit line current $I_{BL}$ drops below the reference level $((1/n)I_{REF})$. The programming pulses applied on the word line, in addition to programming (charging) the selected cell, also tend to cause the over-erased bits in the column (cells with drains connected to bit line) to be charged back toward a positive threshold voltage. Disadvantageously, charging the over-erased bits in an column of cells as part of the program verification can introduce considerable delay in the programming operation.

As miniaturization places even higher premiums on space, it becomes desirable to use less than a full column of cells to generate the reference current. Moreover, use of a full column of reference cells formed in conjunction with the core array (connected to the core array word-lines) is problematical when used in the context of single external voltage devices such as disclosed in U.S. Pat. No. 5,077,691 to Hadad, et al., issued Dec. 31, 1991, e.g., "5.0 Volt-only" memory devices. More particularly, in conventional devices, erasure is effected by applying a relatively high positive voltage to the common source of the cells, grounding the wordline (control gate) and letting the drain (bit line) float. Since the sources of the cells of reference array 114 are not connected to the common source (but are instead grounded), reference array 114 is not affected by the convention erasure process. However, in single external voltage devices, instead of providing a relatively high voltage to the source to effect discharge (erasure), a lower voltage, such as a typical power supply voltage (e.g., +5 volts), is applied to the source in conjunction with applying a relatively high magnitude negative voltage to the control gate (wordline) of the selected cells. Since little current flows through the control gate, the gate voltage can be generated using onboard charge pumps, thus eliminating the need for the second higher voltage power supply. However, since the control gates of the cells in reference array 114 are connected to the wordlines of the core array, the reference array is subjected to a negative potential applied between the control gate (e.g., at negative 10 volts) and source (e.g., at 0 volts), potentially altering the charge on the floating gates of the reference array cells. Thus, in single external power supply devices the reference array is typically located remotely from the core array and formed separately from the core array during the fabrication process.

However, it has been determined that since the reference cells are formed separately from the array cells, the variations in the reference cells from the cells in the array the reference current may not accurately reflect the current generated by an unprogrammed cell in array 104. Such deviation can erroneously cause over-erasure or under erasure. Accordingly, it is desirable to detect deviations in the reference cells from design values (e.g. the array cells) and either vary fabrication parameters to cure the deviation, or compensate for the deviations in operation. However, there has been no ready way to measure the actual threshold voltage of the reference cell and actual sense ratio.

SUMMARY OF THE INVENTION

In accordance with one aspect of the present invention, it has been determined that over-erasure and thus an undesirably wide distribution of threshold voltages can be caused by differences in transconductance (Gm) between the reference cells and core array cells. The present invention provides a method of determining the actual threshold voltage of the reference cell and actual sense ratio to permit adjustment of fabrication parameters to cure the deviation or to vary the sense ratio to compensate for the deviations in the reference cell.

BRIEF DESCRIPTION OF THE DRAWING

The preferred exemplary embodiment of the present invention will hereinafter be described in conjunction with the appended drawing, where like designations denote like elements, and:

FIG. 4 is a partial block schematic of a memory device in accordance with the present invention;

FIG. 5 is a partial block schematic illustrating the effective configuration of the Array $V_T$ mode operation;

FIG. 9 is a schematic block diagram of a diagnostic/correction circuit for adjusting the charge on the floating gates of the reference cells.

DETAILED DESCRIPTION OF A PREFERRED EXEMPLARY EMBODIMENT

Figure 1:
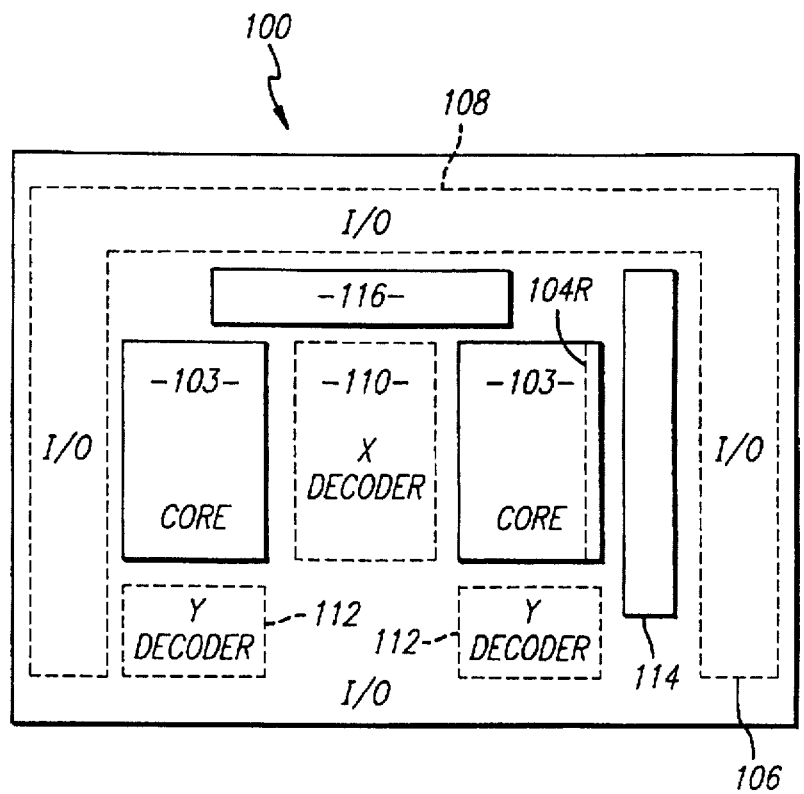
FIG. 1 is a schematic top view of conventional memory device having an area of high density circuitry and an area of lower density circuitry.
Figure 3:
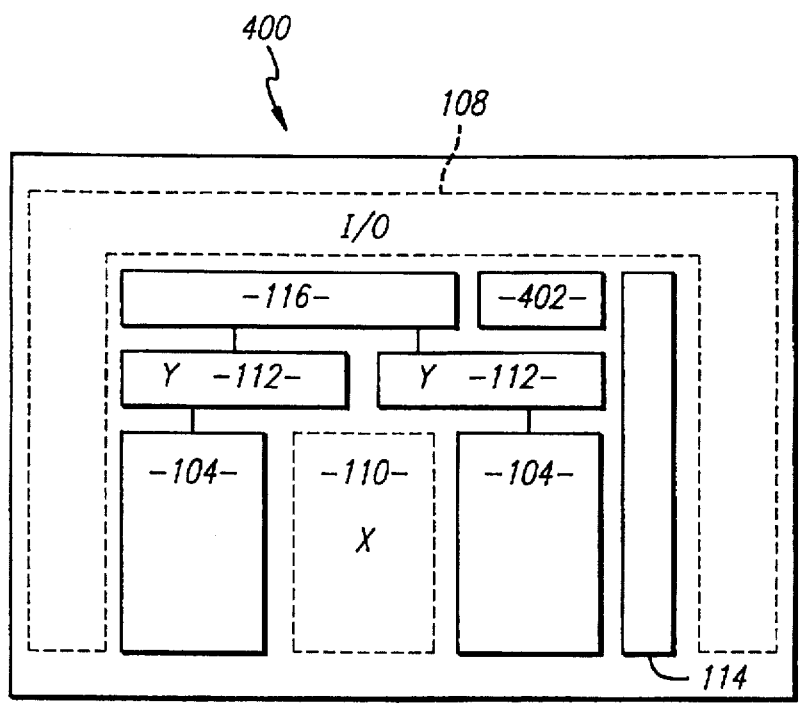
FIG. 3 is a schematic top view of a memory device in accordance with the present invention.

Referring now to FIGS. 3 and 4, an EEPROM 400 in accordance with the present invention comprises, like the prior art, one or more high density core arrays 104 of individual cells 200 and a low density peripheral portion 106, formed in a common substrate. Low density peripheral portion 106 typically includes: suitable input/output (I/O) circuitry 108; suitable circuitry, e.g., one or more x-decoder 110 and y-decoder 112, for, responsive to control signals provided, e.g., through I/O circuitry 108, selectively addressing the individual cells; suitable circuitry 114 for, responsive to control signals provided, e.g. through I/O circuitry 108, selectively connecting the source, gate, and drain of selected addressed cells to predetermined voltages or impedances to effect designated operations on the cell, e.g., programming, reading and erasing, and deriving necessary voltages to effect such operations; and sensing circuitry 116 for determining whether or not an addressed cell has been programmed.

As shown in FIG. 4, sensing circuitry 116 suitably comprises "reference" resistive network 118 (predetermined, nominal resistance R) and "sense ratio" resistive network 120 (predetermined nominal resistance nR), and comparator (e.g. sense amplifier) 122. Again, while resistive networks 118 and 120 are, for clarity, shown in FIG. 4 as simple resistors, in practice they typically comprise variable resistance networks that present predetermined nominal resistances in accordance with control signals applied thereto.

In contradistinction to the prior art, EEPROM 400 includes one or more separate reference cells 402, disposed in low density region 106, suitably remotely from core array 104. A single reference cell 402, or array of reference cells 402 may be utilized. A plurality of reference cells 402 are typically utilized to average out variations in the characteristics of individual cells. In any event, remote array preferably comprises less than an entire column of core array 104, and thus takes up less space on the chip, and is electrically isolated from the core array.

In accordance with another aspect of the present invention, steps are taken to ensure that notwithstanding the formation of reference array 402 separately from core array 104, the reference current generated by reference array 402 accurately reflects the current generated by an unprogrammed cell in array 104, e.g. that the transconductance of the reference cell is equal to the transconductance of the cells of core array 104. The source-drain current vs gate voltage ($I_{ds}$ VS. $V_G$) curves and actual threshold voltage for two cells in core array 104 are determined. Noting that the core array current is equal to the reference array current at the point where a state change is detected (comparator 122 switches state), the threshold voltage $V_{TREF}$ for cells in reference array 402 and the actual sense ratio are then calculated by solving the equations representing the $I_{ds}$ VS. $V_G$ curves for the two array cells. Threshold voltage $V_{TREF}$ may then be adjusted, as needed, and adjustments made to the design of the chip (e.g. to the channel length of reference cells) to correct variations in transconductance Gm of the reference array cells from design values.

More specifically, referring still to FIGS. 3 and 4, in normal read mode operation, Y decoder 112 selectively connects each bit line (BL) of the selected word (single byte) to an associated sense resistive network 120 and comparator 122. However, I/O circuitry 108 is configured to, in response to predetermined control signals applied thereto, e.g., from circuitry 114, selectively connect one or more of the bit lines directly to, e.g., the I/O pads of EEPROM 400, effectively by-passing comparator 122 and sense resistive network 120 and permitting external access to the respective bit lines. Similarly, X decoder 110 is also configured (or an additional decoder 111 is interposed) to, in response to predetermined control signals applied thereto. e.g. from I/O circuitry 108 and/or circuitry 114, selectively connect one of the respective word lines (WL) directly to an external pin, e.g. to the power supply pin of EEPROM 400, to permit external access to the respective word lines. This permits, e.g., operation of EEPROM 400 in various analytical modes.

For example, referring now to FIGS. 4 and 5, one such analytical mode, sometimes referred to herein as the "Array_$V_T$" mode, facilitates direct cell current measurement. In the "Array_$V_T$" mode, the common source line is grounded and connections are effected to selected wordlines and bit lines by decoders 110 and 112 as if in the standard read mode, except that the selected bitline and wordline are connected directly to predetermined externally accessible pins, e.g. the selected wordline is coupled to the power supply pin, and the selected bit line is coupled to the I/O pin. A voltage is applied to the output pins (bit lines) and the current into the device is monitored, and with the gate voltage $V_G$ on the wordline (applied to the power supply pin) will produce the I/V characteristics of the selected cell.

With EEPROM 100 in the "Array_$V_T$" mode configuration i.e., with a predetermined voltage $V_D$ (e.g., 1 to 1.5 volts) applied to the drain (through sense resistance 120, Y decoder 112 and bitline) and the common source line grounded, the current $I_{DS}$ conducted between the drain and source of an individual cell 200 is a function of the voltage $V_G$ applied to control gate 216 of the cell, (i.e., the voltage on the wordline associated with the cell). In general, the cell begins to conduct when gate voltage $V_G$ reaches a threshold value $V_T$ (which, as previously noted, is a function of the charge on floating gate 214 of the cell), and thereafter the current increases as a function of the resistance in the current path and the transconduction of the cell.

In general, the gate voltage ($V_T$) at which a cell begins to conduct varies from cell to cell within the array due to, e.g., over-erasure. The gate voltage $V_{CCMIN}$ applied to the word line at which a cell switches state (with sensing circuitry 116 in the operative system), i.e., the gate voltage at which the cell generates a current equal to the reference current, likewise varies from cell to cell within the array due to, e.g., over-erasure.

Figure 6:
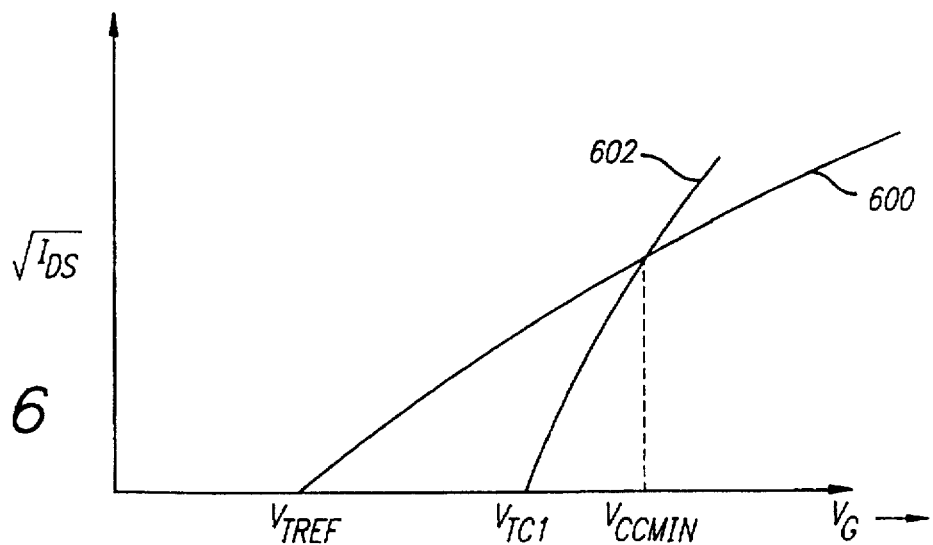
FIG. 6 is a graph of the square root of the drain—source current $(I_{DS})$ versus control gate voltage of an array cell and a reference cell in the normal read mode operation.

The current, $I_{DS}$, conducted by the cell is, in part, a function of the resistance in the current path through the cell, e.g. sense resistance 120 or, in the case of the reference cells 402, reference resistance 118. In normal operation, the resistance (nR) of the sense ratio resistive network is equal to or larger than the resistance of the reference network (R), i.e sense ratio n is at least one. Accordingly, the drain to source current of the core cell tends to increase more quickly in response to changes in gate voltage than does the reference cell. Referring to now to FIG. 6, the reference cell begins conducting upon application of a voltage $V_{TREF}$ to its gate, and conduction increases at a rate generally in accordance with the reference resistance, generally indicated at curve 600. In theory, an unprogrammed array cell would begin to conduct at the same threshold voltage as the reference cell. However, in practice, residual negative charge from incomplete erasure, positive charge caused by overerasure, or deviation in structure form reference cell 402, causes the threshold voltage $V_{TC1}$ of a core array cell (C1) to vary from that of the reference array. More specifically, in the $I_{DS}$ versus $V_G$ curve, generally indicated by 602, of cell C1 of array 104 conduction initiates when the gate voltage reaches a first threshold value $V_{TC1}$ and increases with increasing gate voltage at a rate generally in accordance with the value of the sense resistance network (NR). Accordingly, if the threshold voltage of the array cell ($V_{TC1}$) is greater than the threshold voltage of the reference cell ($V_{TREF}$) there is a discernable gate voltage $V_{CCMIN}$ at which array cell C1 changes state.

Figure 7:
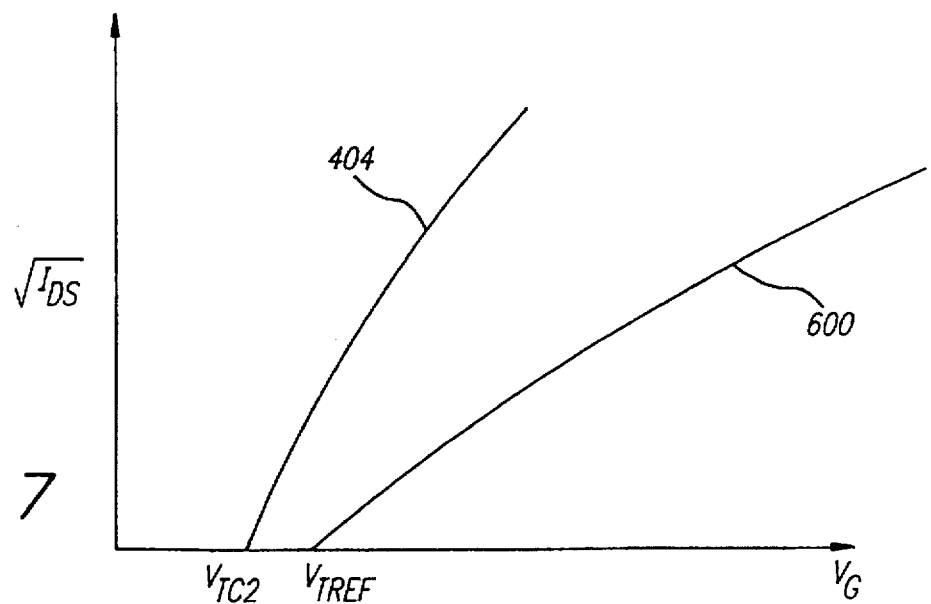
FIG. 7 is a graph of a square root of the drain—source current $(I_{DS})$ versus gate control voltage of an array cell and a reference cell in the normal read mode where the threshold voltage of the array cell is less than the threshold voltage of the reference cell.

However, if the threshold voltage of the array cell is less than the threshold voltage of the reference cell, there is no discernable switching point. Referring to FIG. 7, a different cell C2, with $I_{DS}$ versus $V_G$ curve illustrated by curve 404, initiates conduction at a voltage $V_{TC2}$, which is less than the reference threshold ($V_{TREF}$). In such a case, the actual value of $V_{CCmin}$ cannot be determined; the array cell is already conducting at the lowest comparison point ($V_{TREF}$).

Figure 8:
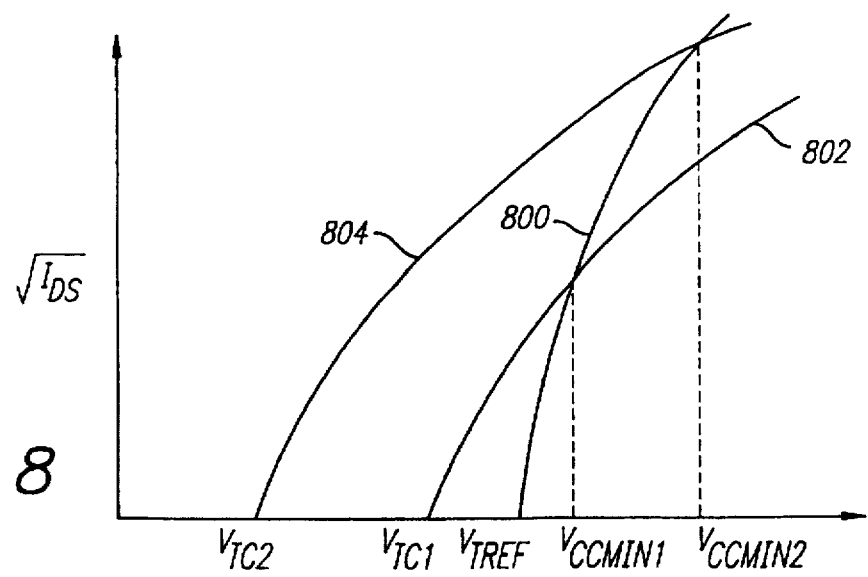
FIG. 8 is graph of the square root of the drain—source current $(I_{DS})$ versus control gate voltage of respective array cells and a reference cell in a "Floor_$V_T$" mode operation.

Accordingly, an internal diagnostic mode operation referred to as the "floor_$V_T$" mode has been developed. In the floor_$V_T$ mode, the relative resistances of the reference resistive network, and sense ratio resistive network are varied such that the rate of change of the source drain current of the reference cell in response to increases in gate voltage is higher than that of the array cells. Referring to FIG. 8, in the floor_$V_T$ mode, the rate of change of the reference current (curve 800) with respect to gate voltage ($V_G$) is significantly higher than that of the array cells Cell1 and Cell2 (curves 802, and 804 respectively). Significantly, even though the threshold voltage of both cells Cell1 and Cell2 are lower than the threshold voltage ($V_{TREF}$) of the threshold cell, in each instance, there is a discernable state change, i.e., at gate voltages equal to $V_{CCMIN1}$, and $V_{CCMIN2}$. That is, at those gate voltages, the magnitude of the current drops below the reference current.

In saturation regime, the drain current $I_{DS}$ of a cell (either core cell or reference cell) is a weak function of drain bias. Drain bias, however, in the read mode (e.g., $V_D$=1.5 volts, source grounded, gate voltage $V_G$), is equal to the difference between the applied gate voltage ($V_G$) and the threshold voltage of the cell ($V_T$) established by the charge on the cell. As previously noted, at the change of state point, ($V_G$= $V_{CCMIN}$) the current of the array cell equals the current of the reference cell divided by the sense ratio (N):

$$I_{DScell} = (1/N) \, I_{DSref} \quad (1)$$

where $I_{DScell}$ is a function of ($V_{CCmin} - V_{Tcell}$) and $I_{DSref}$ is a function of ($V_{CCmin} - V_{tref}$)

In accordance with one aspect of the present invention, it has been determined that the $I_{DS}$ versus $V_G$ curve of a core cell can be represented by, e.g., a fourth degree polynomial:

$$I_{DS}(V_{DB}) = \alpha_0 + \alpha_1(V_{DB}) + \alpha_2(V_{DB})^2 + \alpha_3(V_{DB})^3 + \alpha_4(V_{DB})^4 \quad (2)$$

where $V_{DB}$ is equal to the drain bias, $V_G$ minus $V_T$. The $I_{DS}$ profiles of all of the cells are substantially identical; the respective curves are substantially identical in shape, but shifted by change in threshold voltage.

The coefficients of the fourth degree polynomial are suitably determined by effecting the Array_$V_T$ mode of operation for the EEPROM and measuring the drain source current ($I_{DS}$) of a cell over a range of applied gate voltages, then using conventional curve fitting techniques to establish the corresponding fourth degree polynomial equation. In practice, once the equation is determined for a chip, it can be utilized with all chips of that type.

Once the polynomial for $I_{DS}$ is determined, the reference threshold voltage ($V_{TREF}$) and actual sense ratio can be determined by determining the gate voltage corresponding to state change, $V_{CCMIN}$, and threshold voltage $V_{TCell}$ corresponding to initiation of current flow for two different cells (Cell1 and Cell2) in array 104 and simultaneously solving the equations for those cells:

$$\alpha_0 + \alpha_1*(V_{CCmin1} - V_{Tcell1}) + \alpha_2*(V_{CCmin1} - V_{Tcell1})^2 + \alpha_3*(V_{CCmin1} - V_{Tcell1})^3 + \alpha_4*(V_{CCmin1} - V_{Tcell1})^4 =$$
$$(1/n) [\alpha_0 + \alpha_1*(V_{CCmin1} - V_{Tref}) + \alpha_2*(V_{CCmin1} - V_{Tref})^2 + \alpha_3*(V_{CCmin1} - V_{Tref})^3 + \alpha_4*(V_{CCmin1} - V_{Tref})^4] \quad \text{Equation 3}$$

$$\alpha_0 + \alpha_1*(V_{CCmin2} - V_{Tcell2}) + \alpha_2*(V_{CCmin2} - V_{Tcell2})^2 + \alpha_3*(V_{CCmin2} - V_{Tcell2})^3 + \alpha_4*(V_{CCmin2} - V_{Tcell2})^4 =$$
$$(1/n) [\alpha_0 + \alpha_1*(V_{CCmin2} - V_{Tref}) + \alpha_2*(V_{CCmin2} - V_{Tref})^2 + \alpha_3*(V_{CCmin2} - V_{Tref})^3 + \alpha_4*(V_{CCmin2} - V_{Tref})^4] \quad \text{Equation 4}$$

The threshold voltages $V_{TCell1}$, $V_{TCell2}$ of cells Cell1 and Cell2 can be determined from the $I_{DS}$ versus $V_G$ curve for those cells. The state change voltage $V_{CCMIN}$ of the cells may be determined by reading the cell with different applied gate voltages, and determining the gate voltage at which the cell changes state. The threshold voltage $V_{tref}$ of the reference cell and sense ratio N can then be determined by solving simultaneous equations 3 and 4.

Accordingly, deviations from the design values of reference cell threshold voltage $V_{Tref}$ and sense ratio can be determined, and corrections effected. For example, adjustments can be made, on a dynamic basis, to reference array cell threshold voltage $V_{Tref}$ by placing a positive or negative charge on the floating gate of the reference cells; provisions may be made to selectively charge or discharge the cells of reference array 402 to establish the reference threshold voltage $V_{Tref}$ at the desired level. Referring to FIGS. 3 and 9, EEPROM 400 may be adapted to operate in a diagnostic/correction mode of operation, referred to herein as a "Reference Array correction" mode, in which appropriate potentials are applied, e.g. by circuit 116 to the source 902, drain 904, and control gate 916, of each reference cell, to vary the charge on the floating gates of reference cells 402. For example, appropriate potentials or impedances (e.g. $V_D$=floating, $V_G$=−10 v, $V_S$=5 v) can be applied to source 902, drain 904, and control gate 916, cause electron tunneling from floating gate 914 to source 902 (or drain 904) via Fowler-Nordheim (F-N) tunneling. Thus, reference threshold voltage $V_{tref}$ can be lowered from an initial value. Alternatively, electrons can be removed from the cell floating gate through its tunnel dielectric (to make the floating gate potential more positive). Typical voltages for effecting hot electron injection are $V_D$=5 v, $V_G$=10 v, $V_S$=0 v. Charging floating gate 914 with a negative potential raises reference threshold voltage $V_{Tref}$ by a predetermined amount $V_S$.

Mismatches between the transconductance (GM) of the reference cell and core cell can also be determined, and chip design corrected. If the extracted floor_$V_T$ mode sense ratio is smaller than the design value, the transconductance GM of the reference cell is larger than the core cell GM. If the extracted floor_$V_T$ sense ratio is larger than the design value, the reference transconductance is smaller than the core cell transconductance.

The transconductance of the core cell can then be adjusted. Specifically, the transconductance of the cells is proportional to the width to length ratio of the cell channel (which is in turn determined by the width to length ratio of the gate):

$$G_M = (W/L) \mu C_{ox} \quad (5)$$

where W=the width of the channel, μ is the mobility of the channel, L=the length of the channel and $C_{ox}$=the capacitance of the tunnel oxide. Accordingly, the transconductance GM of the cell can be adjusted by varying the width to length ratio, or oxide capacitance. Generally, the width to length ratio of the cell is readily varied during the fabrication process.

It will be understood that while various of the conductors and connections are shown in the drawing as single lines, they are not so shown in a limiting sense, and may comprise plural conductors or connections as understood in the art. Similarly, various components, control lines, power connections, and the like of EEPROMs 100 and 400, not directly involved in the present invention are omitted from the drawing for the sake of clarity. Further, the above description is of preferred exemplary embodiments of the present invention, and the invention is not limited to the specific forms shown. These and other modifications may be made in the design and arrangement of the elements within the scope of the invention, as expressed in the claims.

What is claimed is:

1. A memory device including an array of cells, where:
    each cell comprises first, second and channel semiconductor regions and a selectively chargeable gate structure including a tunnel dielectric overlying the channel region;
    the first and second regions define a controlled current path through the channel region which tends to be rendered conductive in response to a voltage at least equal to a gate threshold level being applied to the gate structure;
    the gate threshold level is a function of the charge on the gate structure, such that comparison of the current conducted by the cell in response to application to the gate structure of a predetermined voltage to a reference current is indicative of the logical state of the cell; and each cell is dischargeable by movement of era-tiers from the gate structure through the tunnel dielectric to the first semiconductor region to remove the charge on the gate structure;

the device improved wherein:

the reference current is generated by a predetermined number of reference cells disposed separate from the array of cells, the transconductance of such reference cells being adjusted to be equal to the transconductance of the cells of the array.

2. The memory device of claim 1 wherein the array of cells is arranged in a series of rows and columns, with each row having an associated word line electrically connecting the gate structures of each of the cells within the row and each column having an associated bit line electrically connecting the second semiconductor region of each cell within the array electrically connected by a common line.

3. In the formation of a memory device including an array of cells, where:

each cell comprises first, second and channel semiconductor regions and a selectively chargeable gate structure including a tunnel dielectric overlying the channel region;

the first and second regions define a controlled current path through the channel region which tends to be rendered conductive in response to a voltage at least equal to a gate threshold level being applied to the gate structure;

the gate threshold level is a function of the charge on the gate structure, such that comparison of the current conducted by the cell in response to application to the gate structure of a predetermined voltage to a reference current is indicative of the logical state of the cell;

the reference current is generated by a predetermined number of reference cells; and each cell is dischargeable by movement of carriers from the gate structure through the tunnel dielectric to the first semiconductor region to remove the charge on the gate structure, a method of decreasing susceptibility to over-erasure of the cells, comprising the steps of:

determining the transconductance of the cells of the array;

determining the transconductance of the reference cells;

rendering the transconductances of the cells of the array and the reference cells substantially equal.

4. The method of claim 3 wherein the step of rendering the transconductances of the cells of the array and the reference cells substantially equal comprises the step of adjusting the length of the gates of at least one of the cells of the array and the reference cells.

5. The method of claim 3 wherein the step of determining the transconductance of the cells of the array comprises the steps of:

identifying two cells of the array that conduct a current (IDS) equal to the reference current in response to different gate voltages (VG) applied to the gates thereof;

measure the drain-source current (IDS) of each of the identified cells for a plurality of different gate voltages (VG) applied to the gates thereof;

fit the measured values for each cell to polynomial equations.

6. The method of claim 5 wherein the polynomial equations are fourth order equations.

7. A method of adjusting the threshold voltages of memory cells in a reference array to memory cells in a core array in a memory device, where:

each memory cell comprises first, second and channel semiconductor regions and a selectively chargeable gate structure including a tunnel dielectric overlying the channel region;

the first and second regions define a controlled current path through the channel region which tends to be rendered conductive in response to a voltage at least equal to a gate threshold level being applied to the gate structure;

the gate threshold level of the cell is a function of the charge on the gate structure, and the cell can be charged and discharged by movement of carriers between the gate structure and first semiconductor region through the tunnel dielectric in response to potentials applied at the first, and second semiconductor regions and gate structure; and the memory cells of the core array are selectively charged such that comparison of the current conducted by the cell in response to application to the gate structure of a predetermined voltage to a reference current generated by the reference array in response to a corresponding predetermined voltage is indicative of the logical state of the cell the method comprising the steps of:

determining the voltage ($V_{CCmin1}$) applied to the gate structure of a first core array cell at which the cell changes logical state, indicating that the current between first and second semiconductor regions of the first core array cell is equal to the reference current multiplied by a predetermined sense ratio;

determining the voltage ($V_{CCmin2}$) applied to the gate structure of a second core array cell at which the cell changes logical state, indicating that the current between first and second semiconductor regions of the second core array cell is equal to the reference current multiplied by the predetermined sense ratio, where $V_{CCmin2}$ is different from $V_{CCmin1}$;

determining the equation representative of the current between first and second semiconductor regions of the first core array cell as a function of the voltage applied to the gate structure of the first cell;

determining the equation representative of the current between first and second semiconductor regions the second core array cell as a function of the voltage applied to the gate structure of the second cell;

solving the equations representing the currents between first and second semiconductor regions of the first core array cell between first and second semiconductor regions of the second core array cell at the changes of state for the threshold voltage of the reference array cells, and adjusting the charge on the reference cells to calibrate the threshold voltage of the reference array cells to the threshold level of an uncharged core array cell.

* * * * *

UNITED STATES PATENT AND TRADEMARK OFFICE
CERTIFICATE OF CORRECTION

PATENT NO. : 5,629,892
DATED : May 13, 1997
INVENTOR(S) : Yuan Tang

Figure 2:
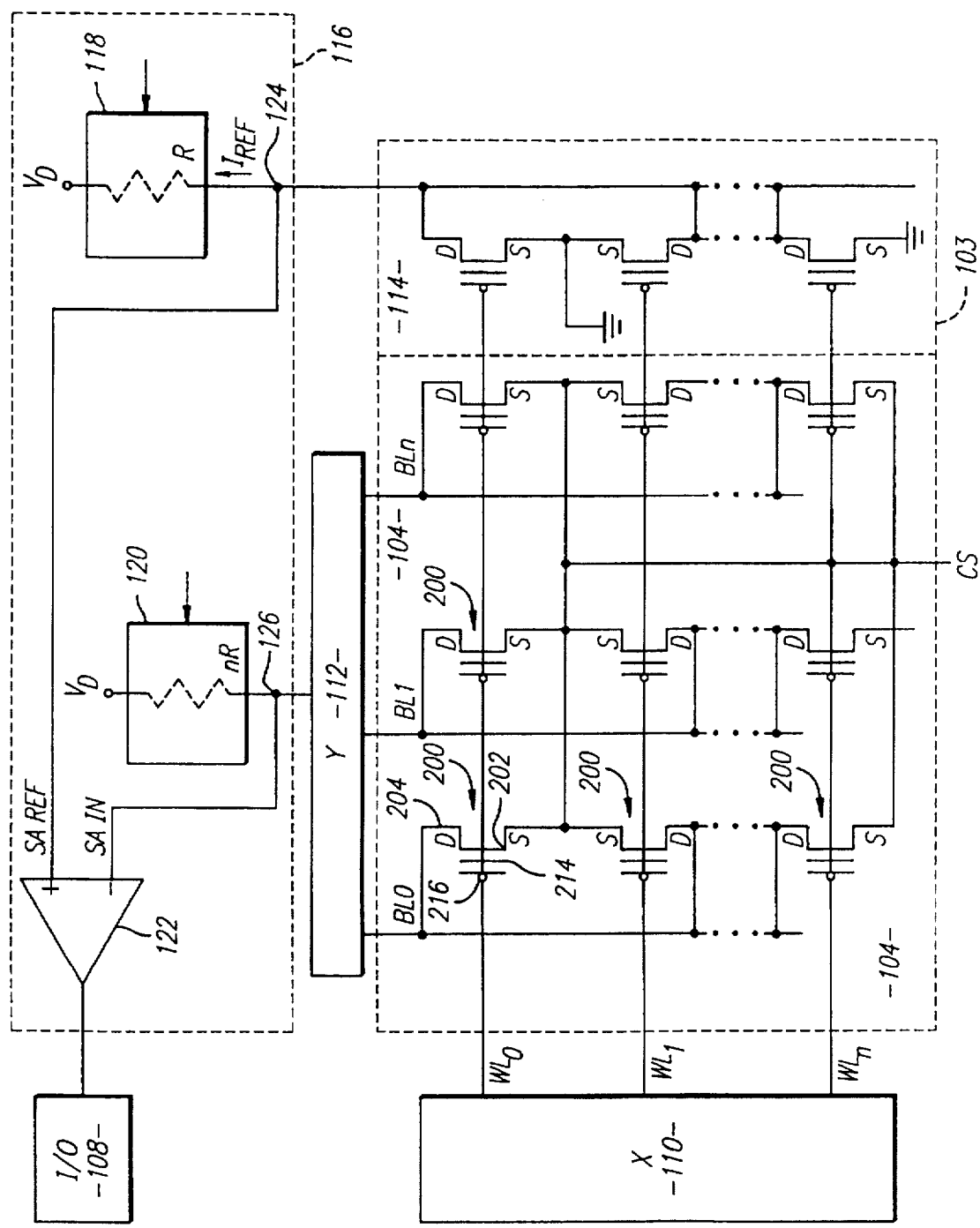
FIG. 2 is a simplified schematic diagram of a portion of a prior art memory device.
Figure 2A:
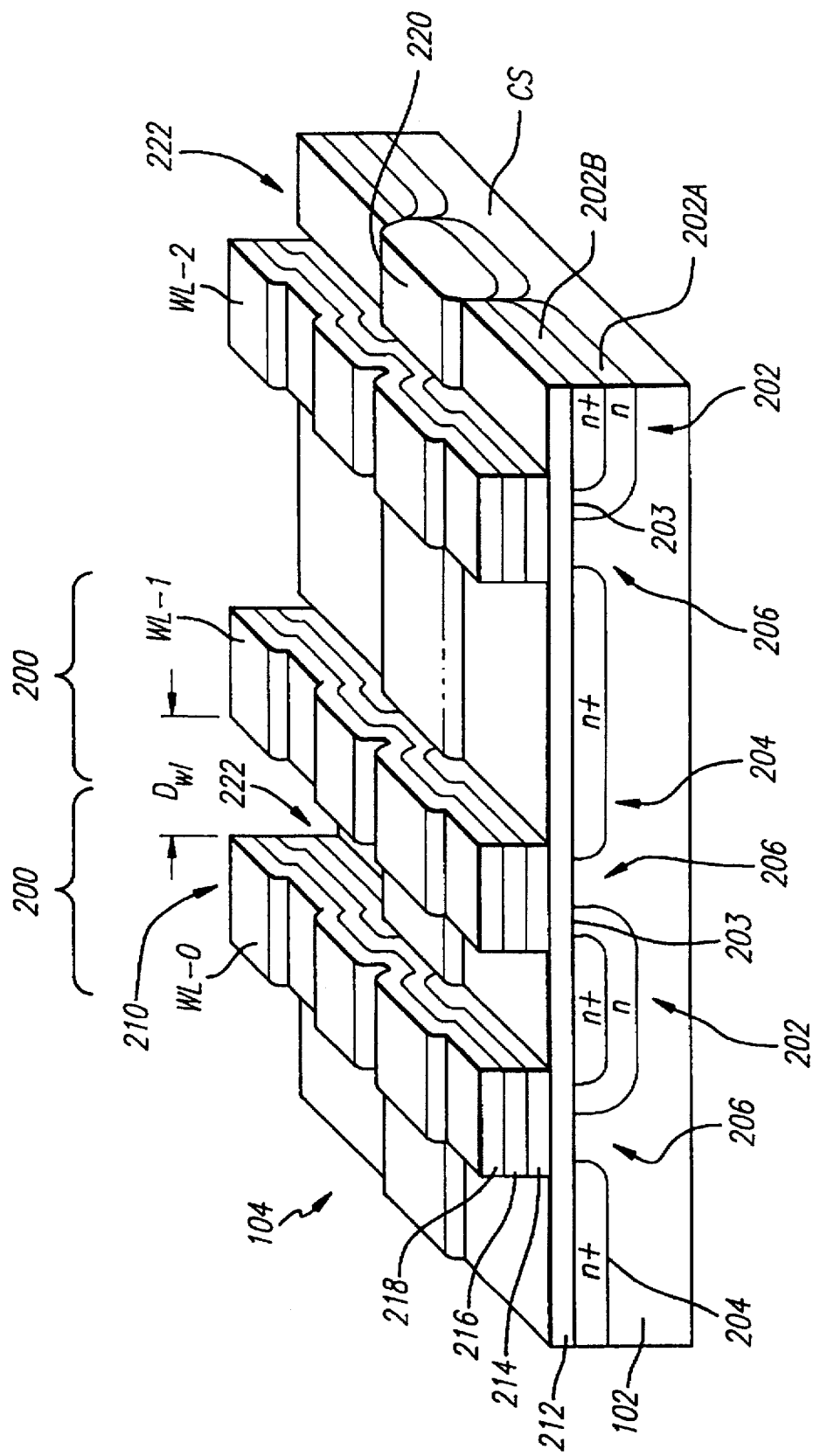
FIG. 2A is a partial, sectional perspective of a portion of an intermediate state (partially complete) of a cell array core 104.

It is certified that error appears in the above-indentified patent and that said Letters Patent is hereby corrected as shown below:

Column 1, line 60, "(FIGS. 2A)" should read --(FIGS. 2, 2A)--.

Column 3, line 27, "indicia or" should read --indicia of--.

Column 6, line 19, "Array $V_T$" should read --Array_$V_T$--.

Column 6, line 58, "predetermined," should read --predetermined--.

Column 7, lines 17 and 23, "VS." should read --vs.--.

Column 9, line 36, "determined" should read --determined,--.

Column 11, line 4, "era-tiers" should read --carriers--.

Signed and Sealed this

Twenty-sixth Day of August, 1997

BRUCE LEHMAN

Attest:

Attesting Officer

Commissioner of Patents and Trademarks